(12) United States Patent
Boran

(10) Patent No.: US 6,513,055 B1
(45) Date of Patent: Jan. 28, 2003

(54) APPARATUS AND METHOD FOR DATA WIDTH REDUCTION IN AUTOMOTIVE SYSTEMS

(75) Inventor: Canice Patrick Boran, Livonia, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/430,762

(22) Filed: Oct. 29, 1999

(51) Int. Cl.[7] .................................................. G06F 7/50
(52) U.S. Cl. ........................................................ 708/551
(58) Field of Search ................................ 708/551, 497, 708/709

(56) References Cited

U.S. PATENT DOCUMENTS

| | | | |
|---|---|---|---|
| 4,236,224 A | | 11/1980 | Chang ........................ 364/724 |
| 4,727,506 A | | 2/1988 | Fling ........................... 364/745 |
| 5,218,563 A | * | 6/1993 | Juri et al. .................... 708/551 |
| 5,329,475 A | * | 7/1994 | Juri et al. .................... 708/551 |
| 5,463,570 A | * | 10/1995 | Nakata ........................ 708/551 |
| 5,493,343 A | | 2/1996 | Knutson et al. ............. 348/691 |
| 5,696,601 A | | 12/1997 | Metcalfe et al. ............ 358/447 |

\* cited by examiner

Primary Examiner—David H. Malzahn
(74) Attorney, Agent, or Firm—Quarles & Brady LLP

(57) ABSTRACT

Reduction of data width in transmitted multi-bit data words in an automotive system is accomplished by truncating the data at its least significant bits and accumulating the truncated bits until, over successive truncated digital words, the sum of the accumulated bits exceeds a threshold equal to the least significant bit of the truncated word. At this time, the truncated word is incremented by one least significant bit and the accumulated value of truncated bits is decremented by an equal amount. In this way, the error does not accumulate in applications which integrate the resulting truncated words.

19 Claims, 2 Drawing Sheets

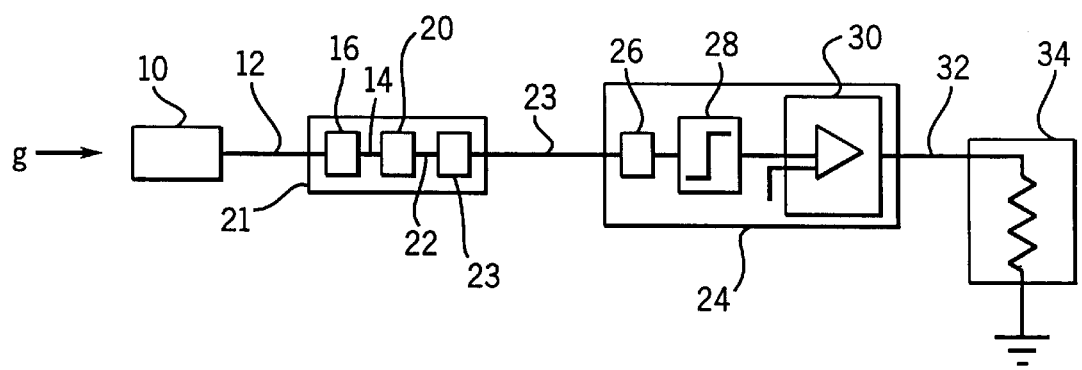
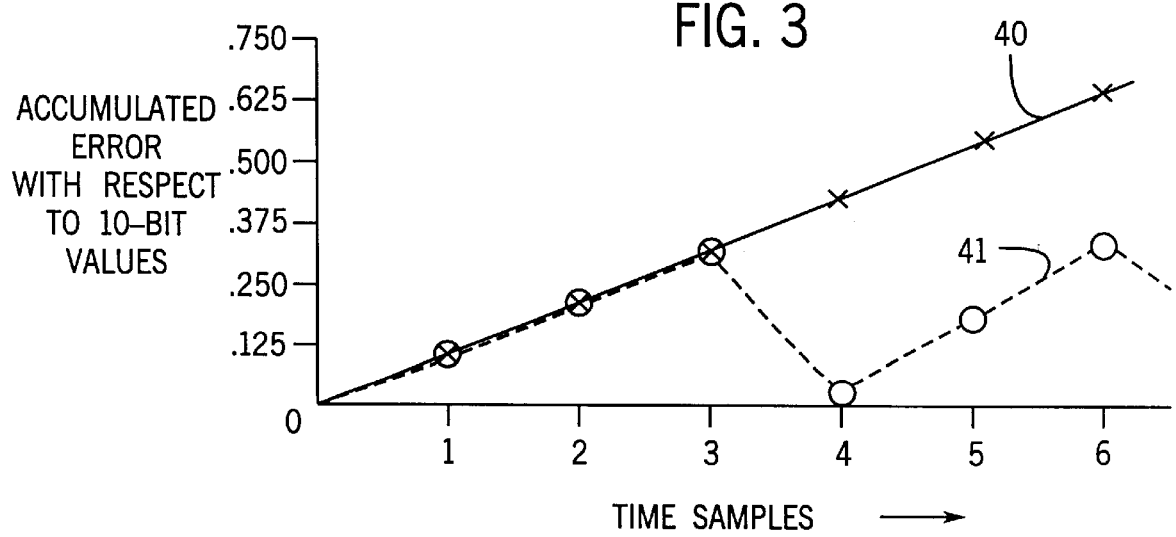

APPARATUS AND METHOD FOR DATA WIDTH REDUCTION IN AUTOMOTIVE SYSTEMS

CROSS-REFERENCE TO RELATED APPLICATIONS

- -

STATEMENT REGARDING FEDERALLY SPONSORED RESEARCH OR DEVELOPMENT

- -

BACKGROUND OF THE INVENTION

The present invention relates to automotive electronics and in particular a method and apparatus for efficiently transmitting digital signals in an automotive environment.

Present day automobiles must process and transmit multi-bit digital data. Such data may be transmitted on multiple conductors, where each conductor carries one bit of the multi digital word ("in parallel"), or on as few as two conductors where the conductors carry each bit of the digital word in sequence ("serially") according to techniques well known in the art. Generally, the transmission of digital data for any significant distance in the automobile is done serially to reduce wiring cost and weight. However, within processing circuitry receiving or transmitting the digital data, such as microprocessors, a parallel bus structure is normally used.

The number of bits in the transmitted digital words, their "width", is preferably minimized to reduce the cost and complexity of the integrated circuits needed to process the data and to reduce the bandwidth needed to transmit the data on the serial conductor. The serial conductors may be shared with other systems or be limited in bandwidth for reasons of power consumption or noise immunity.

One method of reducing the data width of an automotive signal is to truncate the digital word representing that signal by removing the least or most significant bits of the digital word. For example, a ten-bit data value from an accelerometer used to trigger a passive restraint system such as an air bag, and representing 128 g's range may be truncated to eight-bits by eliminating the two least significant bits. This truncation reduces the resolution of the signal from 0.125 g's to 0.5 g's. Alternatively, the ten-bit data value may be truncated to eight-bits by eliminating the two most significant bits causing a reduction in range from 128 g's to 32 g's.

Normally the necessary range is fixed as a function of the application. In the example of the accelerometer, the fill range of 128 g's is required for activation of the airbags. On the other hand, a reduction in resolution may also be unacceptable because it will produce too great of an accumulated error. Generally, a decrease in resolution increases the "quantization error" of the samples, the quantization error being a downward bias caused by implicit rounding during the truncation process. Any time multiple samples are combined, this bias is multiplied producing an accumulated error. If resolution is decreased, an unacceptably large accumulated. error can result. In the example of the accelerometer, during periodic calibration of the zero value of the accelerometer, a number of samples of the accelerometer's output are combined to determine an acceleration offset for the particular accelerometer. Decreasing the resolution of the accelerometer signal causes the accumulated error in the calibration value to quickly rise to unacceptable values.

Ideally there would be a way to minimize the data width of automotive signals without reducing the range of the signal and without producing large accumulated errors over time.

BRIEF SUMMARY OF THE INVENTION

The present inventor has recognized that the accumulated error resulting from a truncation of the least significant bits of a data word, can be substantially decreased if the truncated bits are saved until their total has risen beyond the threshold of the truncation. When this occurs, the next truncated word can be incremented to effectively eliminate the accumulated error caused by the truncation up to that point. By using this process, an integration or summing of the truncated data words will show a much lower error over time.

Specifically then, the present invention provides a method or an apparatus for performing the method of receiving a digital word having a first number of bits including lower order bits. The lower order bits are truncated from the digital word to produce a truncated digital word having a second number of bits less than the first number of bits. An accumulator stores a running total of the truncated lower order bits of the digital word. At times when the value stored in the accumulator exceeds a predetermined threshold, the threshold is subtracted from the accumulator and the truncated word and the threshold value are transmitted. When the accumulator value does not exceed the predetermined threshold, the truncated word is transmitted without the threshold value.

Thus, it is one object of the invention to reduce the width of transmitted digital data, and thus the cost and burden of the transmission, without causing excessive accumulated error. Increased quantization error inherent in truncating lower ordered bits is compensated for by periodically incrementing the values of transmitted data words when excess accumulated error has collected.

The predetermined threshold may equal the place value of the least significant bit of the truncated digital word. The truncated word and threshold may be added together prior to transmission.

Thus, it is another object of the invention to provide a method of correcting the accumulated error without the need for a separate data transmission for the correction value alone. By accumulating the truncated bits until their sum equals the value of the least significant bit of the truncated word, the truncated word that is already slated for transmission is simply incremented by the threshold value., The method may include the steps of repeating the transmission of digital words and integrating the received truncated transmissions as modified by the periodic addition of the threshold value.

Thus, it is another object of the invention to provide a system that minimizes accumulated error in signal processing which includes a step of integration.

The invention may include the additional steps of producing a plurality of average values of the digital words and truncating those average values to produce truncated average values of equal width with the truncated digital words. The bits truncated from the average value are then subtracted from the accumulator value and the truncated average values are subtracted from the truncated digital words to produce a transmission value. When the accumulator value is above the threshold, the threshold is added to the transmission value whereas when the accumulator value is below the predetermined threshold, the transmission value is transmitted alone.

Thus, it is another object of the invention to provide, for a zero correction of a digitized signal that is also resistant to the buildup of accumulated error caused by quantization.

The average values may average the truncated digital words.

Thus, it is another object of the invention to simplify the circuitry necessary to compute the average value by allowing it to operate on the truncated digital words.

The foregoing and other objects and advantages of the invention will appear from the following description. In the description, reference is made to the accompanying drawings which form a part hereof and in which there is shown by way of illustration a preferred embodiment of the invention. Such embodiment does not necessary represent the full scope of the invention, however, and reference must be made to the claims herein for interpreting the scope of the invention.

BRIEF DESCRIPTION OF THE SEVERAL VIEWS OF THE DRAWINGS

FIG. 1 is a schematized perspective view of a passive restraint system having an accelerometer whose output is truncated for transmission and then used at a receiver which includes an integrating section;

FIG. 3 is a graph plotting error over time indicating the improvement or reduction in the buildup of accumulated error in the present invention after the integration section of the processor of FIG. 1.

DETAILED DESCRIPTION OF THE INVENTION

Figure 2:
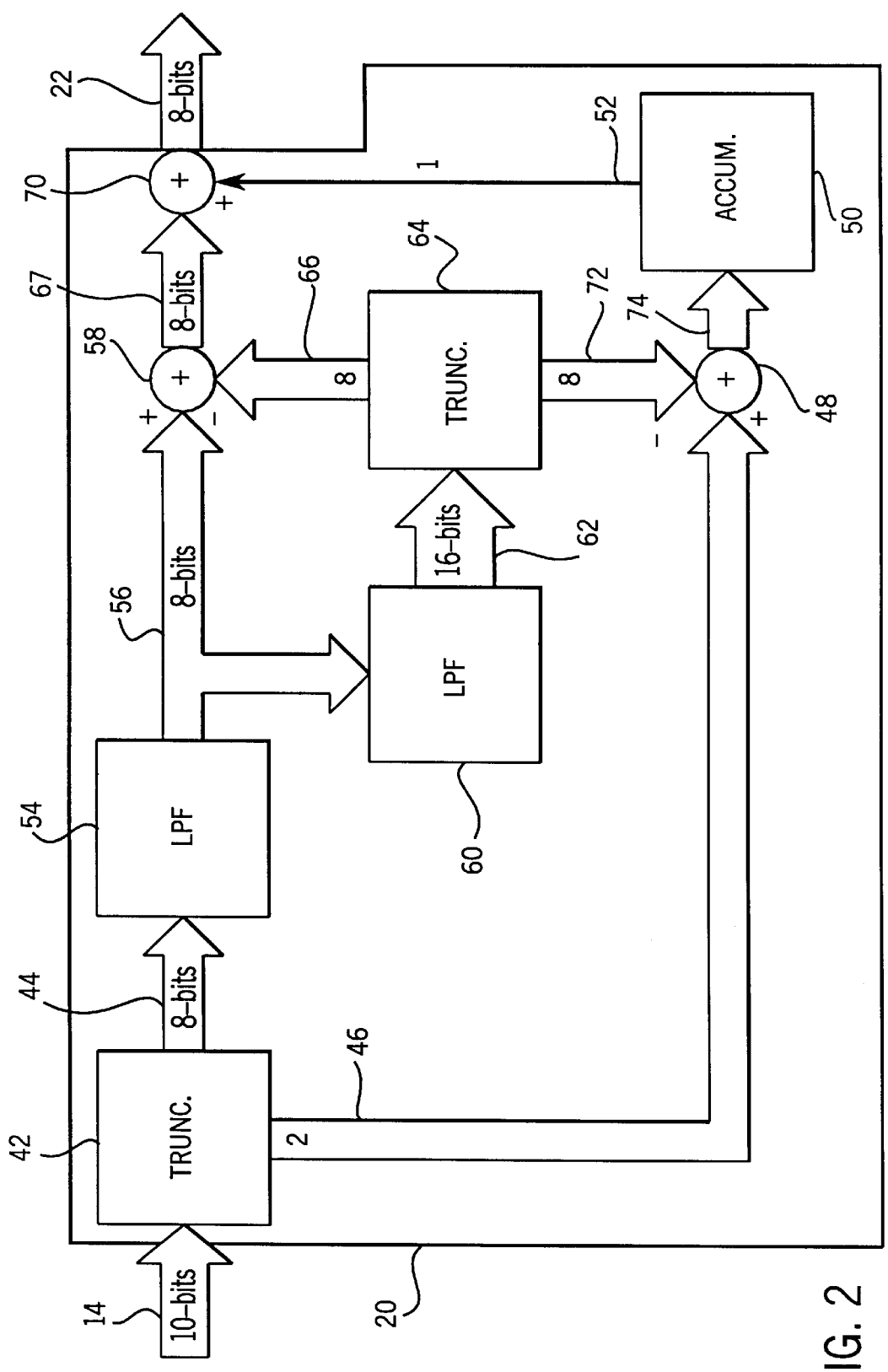
FIG. 2 is a block diagram of the transmitting circuitry of FIG. 1 showing truncation of the accelerometer signal for ultimate transmission as a reduced width signal.

Referring now to FIG. 1, in an example application of the present invention, an automotive accelerometer 10 for use in a passive restraint system or the like, may produce an analog signal 12 providing a measurement of acceleration from –64 to 64g's of acceleration (range of 128 g's). The analog signal 12 is received by a sending circuit 21 including analog-to-digital converter 16, truncation circuit 20, and a transmitting circuit 23.

At the sending circuit 21, the analog signal 12 is sampled and digitized by analog-to-digital converter 16 to produce a stream of ten-bit digital words 14 having 0.125 g resolution. As will be described in more detail below, each ten-bit digital word 14 is then converted to an eight-bit, truncated word 22 by truncation circuit 20 which removes the two least significant bits of the ten-bit digital word 14. Each eight-bit truncated word 22 in turn is forwarded to a transmitting circuit 23 to be transmitted over an eight-bit serial channel 23 to a processing unit 24.

At the processing unit 24, the eight-bit channel 23 is received by a receiving circuit 26 where it is converted from serial to parallel form and then provided to a low pass filter 28 or other device having integrating or summing components. The low pass filter 28 provides an output to discriminating circuit 30 which produces an actuation output 32 to an airbag ignitor 34 or the like.

Upon truncation of the ten-bit digital word 14 to an eight-bit truncated word 22, the resolution of the data is reduced from 0.125 g's to 0.5 g's (i.e., 128 g's divided by 256 rather than 1024). For this reason, an acceleration of, for example, 12.63 g's after truncation will become 12.5 g's on channel 23. In this example there is a 0.13 g quantization error in the eight-bit truncated word 22 in contrast to a 0.005 g quantization error that would have occurred with the ten-bit digital word 14. The error will tend to grow over time when the data samples are integrated, for example, with low pass filter 28.

The following table shows the actual value, the accumulated error for ten-bits, and the incremental accumulated error 40 for eight-bits compared to the error for ten-bits.

TABLE I

| Analog Value | Ten-bit Word | Accumulated Quantization Error | Eight-bit Word | Accumulated Quantization Error 40 |
| --- | --- | --- | --- | --- |
| 12.630 | 12.625 | 0.005 | 12.5 | 0.125 |
| 12.630 | 12.625 | 0.010 | 12.5 | 0.250 |
| 12.630 | 12.625 | 0.015 | 12.5 | 0.375 |
| 12.630 | 12.625 | 0.020 | 12.5 | 0.500 |
| 12.630 | 12.625 | 0.025 | 12.5 | 0.625 |
| 12.630 | 12.625 | 0.030 | 12.5 | 0.750 |

Referring to FIG. 3, the accumulated error 40 is essentially unbounded as additional samples are integrated. In general, signal processing applications will have a limited time window of accumulation and thus there is in fact a limit to the accumulated error, but nevertheless it may rise to relatively high values for large window sizes.

Referring now to FIG. 2, the present invention avoids the problem of high rates of accumulated error by preserving two-bit remainders 46 that result from the truncation of the ten-bit digital words 14 to eight-bit truncated words 44. The two-bit remainders 46, which are the least significant two bits of the ten-bit digital words 14, are sent to adder 48 to ultimately pass to an accumulator 50 which may in this example be an eight-bit binary adder having an overflow 52 as will be described below.

The eight-bit truncated words 44 are sent to a low pass filter 54, which in the preferred embodiment for an accelerometer system, is a two-pole, two-zero, low pass filter intended to remove noise components from the accelerometer signal. From there, filtered, eight-bit data 56 branches in two paths, first to an adder 58 as will be described below and secondly to a low pass filter 60. The low pass filter 60 provides a zero reference for the accelerometer signal by having a passband frequency substantially lower than the expected frequency bandwidth in the analog signal 12 of the accelerometer 10.

The low pass filter 60 provides a sixteen-bit output 62 which is then truncated by truncator 64 to eight-bit words 66, leaving an eight-bit remainder 72 which is sent to adder 48. The eight-bit words 66 are then subtracted from the filtered, eight-bit data 56 by adder 58 to produce an eight-bit zero reference signal 67. This zero reference signal is received by adder 70 as will be described further below.

As mentioned above, at truncator 64 the eight-bit remainders 72 are passed to adder 48 and there they are summed with the two-bit remainders 46 from the truncator 42 after registration of these bits so that the two-bits remainders 46 align with the most significant bits of the eight-bit remainder 72 from truncator 64. The resulting sum 74 is passed to the accumulator 50 which accommodates eight-bits exactly and overflowed on the ninth bit to produce an overflow 52. Generally, the accumulator 50 effectively compares the accumulated. sum of two-bit remainders 46 and eight-bit remainders 72 to an implicit threshold equal to the least significant bit of the eight-bit truncated words 44. The overflow 52 is then added by means of adder 70 to eight-bit zero reference signal 67 for transmission on channel 23.

Referring to the example described above with respect to Table I, a measurement of 12.630 g will thus be converted to a ten-bit value of 12.625 as a result of the 0.125 G resolution of a ten-bit data words 14 spanning 128 g's. The actual ten-bit representation in binary will be 0001100101 which when truncated eight-bits will be 00011001. The least significant remainder bits "01" have been removed and are accumulated by accumulator 50. As shown in Table 2 below, at each successive receipt of a ten-bit value having a constant 12.630 g measurement, additional remainder bits will be accumulated to total as shown in the first column of Table II.

TABLE II

| Accumulated Remainder Bits 74 | Transmitted Eight-Bit Value 22 | Quantization Error (compared to ten-bits) | Accumulated Error (compared to ten-bits) 41 |
|---|---|---|---|
| 01 | 12.5 | −0.125 | −0.125 |
| 10 | 12.5 | −0.125 | −0.25 |
| 11 | 12.5 | −0.125 | −0.375 |
| 00 | 13.0 | +0.500 | 0 |
| 01 | 12.5 | −0.125 | −0.125 |
| 10 | 12.5 | −0.125 | −0.25 |
| 11 | 12.5 | −0.125 | −0.375 |

By the fourth such received ten-bit word 14, the accumulator 50 will overflow and increment the transmitted eight-bit word 22 which moves from 12.5 to 13. In the process, the accumulator 50 is zeroed and the quantization error moves from −0.125 to +0.5. The result of this is to correct the accumulated error 41 with respect to the error that would having occurred with ten bits, to zero as shown in FIG. 3. Thus, in systems which integrate the transmitted signal, the maximum accumulated error is bounded to relatively low values.

It will be understood that the present invention is not limited to truncating ten-bits to eight-bits but may be used for an arbitrary truncation with appropriate adjustment of the threshold implicit in the accumulator 50. Further, although the example shows only the accumulation of the truncated bits from truncation process 42, in practice the invention also incorporates the eight bit remainder 72 from truncator 64 which are left justified with the accumulated truncated bits from truncator 64 by an implicit divide by sixty-four operation.

The above description has been that of a preferred embodiment of the present invention, it will occur to those that practice the art that many modifications may be made without departing from the spirit and scope of the invention. Clearly, for example, the present invention is not limited to use with a passive restraint system but may be used generally with any automotive system producing digital words of data where data width is a concern. In order to apprise the public of the various embodiments that may fall within the scope of the invention, the following claims are made.

I claim:

1. A method of reducing the number of bits that must be transmitted in an automotive system comprising the steps of:
   a) receiving a digital word having a first number of bits including lower order bits;
   b) truncating the lower order bits of the digital word to produce a truncated digital word having a second number of bits less than the first number of bits;
   c) accumulating the truncated lower order bits of the digital word in an accumulator;
   d) when the accumulated, truncated, lower-order bits exceed a predetermined threshold, subtracting the threshold from the accumulator and transmitting the truncated word and the threshold; and
   e) when the accumulated truncated bits do not exceed the predetermined threshold, transmitting the truncated word without the threshold.

2. The method of claim 1 wherein the threshold is a place value of a least significant bit of the truncated digital word.

3. The method of claim 1 wherein step (d) includes the step of adding the truncated word and the threshold together prior to transmission.

4. The method of claim 1 including the steps of:
   (f) repeating steps (a) through (e) for a plurality of digital words
   (g) receiving the transmissions of steps (d) and (e); and
   (h) integrating the received transmissions.

5. The method of claim 4 wherein the integration is part of a low pass filtering.

6. The method of claim 1 including the step of receiving an analog value and converting the analog value into the digital word.

7. A method of reducing the number of bits that must be transmitted in an automotive system comprising the steps of:
   a) receiving a plurality of first digital words each having a first number of bits including lower order bits;
   b) truncating the lower order bits of the digital words to produce a plurality of truncated digital words, each having a second number of bits less than the first number of bits;
   c) accumulating the truncated lower order bits of the plurality of first digital words in an accumulator;
   d) producing a plurality of average values of the plurality of first digital words, the average values having a third number of bits including lower order bits;
   e) truncating the lower order bits of the average values to produce a plurality of truncated average values having the second number of bits less than the third number of bits;
   f) subtracting the truncated average values from the truncated digital words to produce a plurality of transmission values;
   g) subtracting the truncated lower order bits of the plurality of average values from the accumulator;
   h) when the accumulated truncated lower order bits exceed a predetermined threshold, subtracting the threshold from the accumulator and transmitting the transmission value and the threshold; and
   i) when the accumulated truncated bits do not exceed the predetermined threshold, transmitting the transmission value without the threshold.

8. The method of claim 7 wherein step (d) averages the truncated digital words.

9. The method of claim 7 wherein the threshold is a place value of a least significant bit of the truncated digital word.

10. The method of claim 7 including the step of adding the transmission value and the threshold together prior to transmission.

11. The method of claim 7 including the steps of:
   (j) receiving the transmissions of steps (h) and (i); and
   (k) integrating the received transmissions.

12. The method of claim 11 wherein the integration is part of a low pass filtering.

13. The method of claim 7 including the step of receiving a plurality of analog values and converting the analog values into the digital words.

14. An electronic circuit transmitting digital values in an automobile comprising:
- an input receiving a digital word having a first number of bits including lower order bits;
- a quantizer truncating the lower order bits of the digital word to produce a truncated digital word having a second number of bits less than the first number of bits;
- an accumulator summing the truncated lower order bits of the digital word to a stored value;
- transmission circuitry communicating with the quantizer and the accumulator to transmit the truncated word and a predetermined threshold when the accumulated truncated lower order bits exceed the threshold and to subtract the threshold from the accumulator and;
- transmitting the truncated word without the threshold when the accumulated truncated bits do not exceed the predetermined threshold.

15. The electronic circuit of claim 14 wherein the accumulator is a counter overflowing at the threshold.

16. The electronic circuit of claim 15 wherein the transmission circuit includes an adder adding the truncated word and an overflow signal from the counter.

17. The electronic circuit of claim 14 including a receiving circuit integrating the transmitted truncated words and thresholds.

18. The electronic circuit of claim 17 wherein the receiving circuit is a low pass filter.

19. The electronic circuit of claim 14 including an analog to digital converter receiving an analog value and converting it into the digital word for the input.

* * * * *